United States Patent
Urano

(10) Patent No.: US 9,666,437 B2
(45) Date of Patent: May 30, 2017

(54) METHOD FOR MANUFACTURING SEMICONDUCTOR DEVICE

(71) Applicant: FUJI ELECTRIC CO., LTD., Kawasaki-shi, Kanagawa (JP)

(72) Inventor: Yuichi Urano, Matsumoto (JP)

(73) Assignee: FUJI ELECTRIC CO., LTD., Kawasaka-shi (JP)

(*) Notice: Subject to any disclaimer, the term of this patent is extended or adjusted under 35 U.S.C. 154(b) by 0 days.

(21) Appl. No.: 14/878,480

(22) Filed: Oct. 8, 2015

(65) Prior Publication Data

US 2016/0027648 A1    Jan. 28, 2016

Related U.S. Application Data

(63) Continuation of application No. PCT/JP2014/070283, filed on Jul. 31, 2014.

(30) Foreign Application Priority Data

Sep. 27, 2013   (JP) .................................. 2013-202726

(51) Int. Cl.
*H01L 21/283* (2006.01)
*H01L 23/36* (2006.01)
(Continued)

(52) U.S. Cl.
CPC .......... *H01L 21/283* (2013.01); *H01L 21/304* (2013.01); *H01L 21/6835* (2013.01);
(Continued)

(58) Field of Classification Search
CPC . H01L 21/283; H01L 21/304; H01L 21/6835; H01L 23/051; H01L 23/36;
(Continued)

(56) References Cited

U.S. PATENT DOCUMENTS 8,187,949 B2    5/2012   Kameyama
2003/0022464 A1    1/2003   Hirano et al.
(Continued)

FOREIGN PATENT DOCUMENTS

CN    101632155 A    1/2010
JP    2002-110893 A    4/2002
(Continued)

OTHER PUBLICATIONS

PCT, "International Search Report for International Application No. PCT/JP2014/070283".

(Continued)

*Primary Examiner* — Thanh T Nguyen
(74) *Attorney, Agent, or Firm* — Manabu Kanesaka

(57) ABSTRACT

A method for manufacturing a semiconductor device including a semiconductor chip having a front surface electrode and a rear surface electrode provided on a front surface and a rear surface, respectively, the method includes a front surface electrode layer forming step of forming a front surface electrode layer as the front surface electrode on a front surface of a semiconductor wafer forming the semiconductor chip; a thinning step of grinding a rear surface of the semiconductor wafer to reduce a thickness of the semiconductor wafer after the front surface electrode layer forming step; a plating step of forming an electrode plating film as the front surface electrode on a surface of the front surface electrode layer after the thinning step; and a rear surface electrode forming step of forming the rear surface electrode on the ground rear surface of the semiconductor wafer after the plating step.

20 Claims, 8 Drawing Sheets

(51) Int. Cl.
*H01L 21/683* (2006.01)
*H01L 23/433* (2006.01)
*H01L 23/495* (2006.01)
*H01L 23/00* (2006.01)
*H01L 23/051* (2006.01)
*H01L 21/304* (2006.01)
*H01L 23/31* (2006.01)

(52) U.S. Cl.
CPC ............ *H01L 23/051* (2013.01); *H01L 23/36* (2013.01); *H01L 23/4334* (2013.01); *H01L 23/49562* (2013.01); *H01L 24/33* (2013.01); H01L 23/3107 (2013.01); H01L 2224/48091 (2013.01); H01L 2224/48247 (2013.01); H01L 2224/73265 (2013.01); H01L 2924/13055 (2013.01); H01L 2924/13091 (2013.01); H01L 2924/181 (2013.01)

(58) Field of Classification Search
CPC ........... H01L 23/4334; H01L 23/49562; H01L 24/33; H01L 2224/48091; H01L 2224/48247; H01L 2224/73265; H01L 23/3107; H01L 2924/13055; H01L 2924/13091; H01L 2924/181
See application file for complete search history.

(56) References Cited

U.S. PATENT DOCUMENTS

| | | |
|---|---|---|
| 2003/0132530 A1 | 7/2003 | Teshima et al. |
| 2005/0170555 A1 | 8/2005 | Hirano et al. |
| 2007/0004098 A1 | 1/2007 | Kazama et al. |
| 2010/0044873 A1 | 2/2010 | Kameyama |
| 2011/0256668 A1* | 10/2011 | Urano ................. H01L 21/6836 438/114 |

FOREIGN PATENT DOCUMENTS

| | | |
|---|---|---|
| JP | 2002-129342 A | 5/2002 |
| JP | 2003-110064 A | 4/2003 |
| JP | 2004-303915 A | 10/2004 |
| JP | 2004-327464 A | 11/2004 |
| JP | 2005-019830 A | 1/2005 |
| JP | 2005-353960 A | 12/2005 |
| JP | 2006-261415 A | 9/2006 |
| JP | 3823974 B2 | 9/2006 |
| JP | 3829860 B2 | 10/2006 |
| JP | 2007-027477 A | 2/2007 |
| JP | 2007-036211 A | 2/2007 |
| JP | 4049035 B2 | 2/2008 |
| JP | 2008-227284 A | 9/2008 |
| JP | 2009-094287 A | 4/2009 |
| JP | 4344560 B2 | 10/2009 |
| JP | 2010-103310 A | 5/2010 |
| JP | 2010-185113 A | 8/2010 |
| JP | 2010-283312 A | 12/2010 |

OTHER PUBLICATIONS

Denkimekki Kenkyukai, "Electroless Plating Fundamentals and Applications", Nikkan Kogyo Shimbun, Ltd., May 1994, pp. 36 & 37.
Disco Corporation, "Taiko Process", [online], 2001 to 2013, Internet, (Searched in Sep. 9, 2013).
China Patent Office, "Office Action for Chinese Patent Application No. 201480020633.7," Jan. 16, 2017.

* cited by examiner

Prior Art

Prior Art

Prior Art

METHOD FOR MANUFACTURING SEMICONDUCTOR DEVICE

CROSS-REFERENCES TO RELATED APPLICATIONS

The present application is a Continuation Application of PCT International Application No. PCT/JP2014/070283 filed Jul. 31, 2014, and claiming priority from Japanese Application No. 2013-202726 filed Sep. 27, 2013, the disclosure of which is incorporated herein.

TECHNICAL FIELD

The present invention relates to a method for manufacturing a semiconductor device.

BACKGROUND ART

An insulated gate bipolar transistor (IGBT) which is one of power semiconductor elements has the high-speed switching characteristics and voltage-driven characteristics of an insulated gate field effect transistor (MOSFET), and the low on-voltage characteristics of a bipolar transistor. The application range of the IGBT has expanded from the devices according to the related art, such as a general-purpose inverter, an AC servo system, an uninterruptible power supply (UPS), and a switching power supply, to a DC-DC step-up converter for a hybrid vehicle.

The following method has been proposed as a method for manufacturing the above-mentioned semiconductor element. A front surface structure of the element is formed on the front surface side of a silicon (Si) substrate and the rear surface is ground to reduce the thickness of the substrate. A buffer layer and a contact layer are formed on the rear surface of the silicon substrate. Then, an aluminum silicon (AlSi) layer which has a thickness that is equal to or greater than 0.3 µm and equal to or less than 1.0 µm and a silicon concentration that is equal to or greater than 0.5 wt % and equal to or less than 2 wt %, preferably, less than 1 wt % is formed on the surface of the contact layer on the rear surface. Then, a plurality of metal layers made of, for example, titanium (Ti), nickel (Ni), and gold (Au) is sequentially formed on the surface of the aluminum silicon layer by vapor deposition or sputtering (for example, see the following Patent Document 1).

In the mounting of a vertical semiconductor element, such as an IGBT having electrodes on the front and rear surfaces, a rear surface electrode, such as a collector electrode, is bonded to a metal plate, which will be a heat sink, by solder. In general, a front surface electrode, such as an emitter electrode, is bonded by wire bonding using an aluminum wire. However, in recent years, in some cases, solder has been used to bond the front surface electrode. When solder is used to bond the front surface electrode, it is possible to significantly improve various characteristics. For example, it is possible to increase mounting density and current density, to reduce wiring capacity for increasing a switching speed, and to improve the cooling efficiency of a semiconductor device.

As a semiconductor device in which other members are soldered to the front surface electrode of the semiconductor element, the following device has been proposed. The rear surface of a first conductor member, which will be a heat sink, is soldered to a front surface electrode of each semiconductor chip and the front surface of a second conductor member is soldered to the rear surface of each semiconductor chip. The rear surface of a third conductor member is soldered to the front surface of the heat sink. A step portion is provided in the heat sink and a thin portion is formed. The bonding area between the heat sink and the third conductor member is less than the bonding area between the heat sink and each semiconductor chip. Each member is sealed with a resin, with the rear surface of the second conductor member and the front surface of the third conductor member being exposed (for example, see the following Patent Document 2).

As another device, a semiconductor device has been proposed which includes a semiconductor element, a first metal body, a second metal body, and a third metal body and is substantially entirely molded by a resin. The first metal body is bonded to the rear surface of the semiconductor element and functions as both an electrode and a radiator. The second metal body is bonded to the front surface of the semiconductor element and functions as both an electrode and a radiator. The third metal body is bonded between the front surface of the semiconductor element and the second metal body. The thickness of the semiconductor element is reduced such that the shear stress of the front surface of the semiconductor element is reduced or a distortion component in a bonding layer for bonding the semiconductor element and the metal body is reduced. In addition, the bonding layer is made of tin (Sn)-based solder (for example, see the following Patent Document 3).

In practice, when other members are soldered to the front surface electrode of the semiconductor element, it is necessary to form a plated film made of, for example, nickel on the surface of the front surface electrode in order to improve the adhesion between solder and the front surface electrode. In general, for example, an electroplating method or an electroless plating method is used as a plating method for forming the plated film. The electroplating method supplies an external current to the member to be plated to reduce and deposit metal ions in a solution on the member to be plated. The electroless plating method chemically reduces and deposits metal ions in a solution on the member to be plated, without using electricity (for example, see the following Non-Patent Document 1). The electroless plating method makes it possible to simplify the structure of a processing apparatus or a treatment process, as compared to the electroplating method which requires an electric circuit, such as a counter electrode or a DC power supply.

The following device has been proposed as a semiconductor device provided with a semiconductor element (semiconductor chip) in which a plated film is formed on the surface of a front surface electrode by the electroless plating method. A rear surface electrode of the semiconductor element is bonded to a circuit pattern formed on an insulating substrate and the front surface electrode is bonded to a connection conductor. An electrode plating film, which is formed by sequentially laminating a nickel plated film and a gold plated film using an electroless plating process using a zincate method, is formed on an aluminum layer forming the front surface electrode of the semiconductor chip. The thermal conductivity of the electrode plating film is uniform in order to form the electrode plating film using the electroless plating process using the zincate method. The electrode plating film is bonded to a connection conductor which will be a radiation path, with a lead-free solder layer which includes little lead interposed therebetween (for example, see the following Patent Document 4).

Next, a method for manufacturing an IGBT will be described as an example of a method for manufacturing a semiconductor device provided with a semiconductor element (semiconductor chip) in which other members can be soldered to a front surface electrode. FIG. 15 is a flowchart illustrating a method for manufacturing a semiconductor device according to the related art. FIGS. 16 to 21 are cross-sectional views illustrating the state of the semiconductor device according to the related art during manufacture. First, as illustrated in FIG. 16, a front surface structure (not illustrated) of an IGBT including, for example, a base region and an emitter region is formed in a surface layer of the front surface of a semiconductor wafer 100 (Step S101). A front surface structure is formed in each region which becomes a semiconductor chip after dicing (cutting). Then, a gate electrode and am emitter electrode which contact a gate region and the emitter region, respectively, is formed as a front surface electrode 101 (Step S102).

Then, as illustrated in FIG. 17, a protective film 102 which is made of polyimide is formed on the entire front surface of the semiconductor wafer 100. Then, the protective film 102 is patterned such that a portion on the front surface electrode 101 of the protective film 102 is removed and an opening portion through which the front surface electrode 101 is exposed is formed. Then, as illustrated in FIG. 18, the rear surface of the semiconductor wafer 100 is ground (back grinding) and the rear surface is etched to thin the semiconductor wafer 100 to the thickness of a product used as a semiconductor device (hereinafter, in some cases, this process is referred to as a "thinning process") (Step S103). Then, ion implantation and thermal diffusion are performed to form a rear surface structure (not illustrated), such as a collector region, in a surface layer of the rear surface of the semiconductor wafer 100 (Step S104).

Then, as illustrated in FIG. 19, a plurality of metal layers is sequentially formed on the rear surface of the semiconductor wafer 100 by a physical vapor deposition (PVD) method, such as a sputtering method, to form a rear surface electrode 103 (Step S105). Then, as illustrated in FIG. 20, a supporting substrate 104 is bonded to the rear surface of the semiconductor wafer 100 to protect the rear surface electrode 103. Then, as illustrated in FIG. 21, a plurality of plated films 105 is sequentially formed on the surface of the front surface electrode 101 by the electroless plating process to form an electrode plating film (Step S106). Then, the semiconductor wafer 100 is diced. In this way, a semiconductor chip having the plated film 105 formed on the surface of the front surface electrode 101 is completed.

The following manufacturing method has been proposed as a method for manufacturing the semiconductor device in which the plated film is formed on the surface of the front surface electrode by the electroless plating method. When electroless plating is performed on the surface of an electrode terminal which is formed on the front surface side of a wafer made of silicon, a dicing tape serving as an electrical insulating material is bonded to the entire rear surface of the wafer to insulate the wafer. Then, a plated film is formed on the surface of the electrode terminal by electroless plating (for example, see the following Patent Document 5).

In addition, the following method has been proposed as a method for manufacturing a semiconductor device in which both surfaces of a semiconductor chip are interposed between a pair of metal plates and which is substantially entirely molded by a resin. A heat treatment is performed on a laminate of a first metal body, a first bonding material, a semiconductor element, a second bonding material, a third metal body, a third bonding material, and a second metal body, with the laminate held by a holding jig. In this way, the first metal body and the semiconductor element are bonded to each other, the semiconductor element and the third metal body are bonded to each other, and the third metal body and the second metal body are bonded to each other (for example, see the following Patent Document 6). In the manufacturing method disclosed in Patent Document 6, the occurrence of the operation failure of the semiconductor device caused by the movement of the metal plate bonded to the semiconductor chip during the final bonding process and a reduction in the lifespan of the semiconductor device are suppressed.

The following method has been proposed as a method for manufacturing a semiconductor chip provided in a semiconductor device in which metal bodies that function as both an electrode and a radiator are provided on a front surface electrode and a rear surface electrode of the semiconductor chip and which is substantially entirely molded by a resin. The front surface electrode is formed on the front surface of a semiconductor wafer, with the rear surface of the semiconductor wafer fixed to a supporting substrate (for example, see the following Patent Document 7).

As another method, the following method has been proposed. First, a plated film is formed on the front surface of a semiconductor wafer to form a front surface electrode and the rear surface of the semiconductor wafer is ground to reduce the thickness of the semiconductor wafer. Then, a rear surface electrode including a nickel film is formed on the ground rear surface of the semiconductor wafer and a plated film is formed on the front surface of the semiconductor wafer (for example, see the following Patent Document 8).

As still another method, the following method has been proposed. First, a semiconductor element region in which a plurality of semiconductor regions with different properties is arranged in a predetermined positional relationship is formed on the front surface side of a semiconductor wafer. Then, a front-surface-side electrode which is patterned in a predetermined positional relationship with respect to the positional relationship of the semiconductor element region is formed on the front surface side of the semiconductor wafer. Then, a dicing tape with a dicing frame is fixed to the rear surface of the semiconductor wafer. Then, a plating process is performed on the front surface of the semiconductor wafer while the semiconductor wafer is supported through the dicing frame (for example, see the following Patent Document 9).

As yet another method, the following method has been proposed. First, a plated film is formed on the surface of an aluminum electrode on the front surface of a semiconductor wafer. Then, the rear surface of the semiconductor wafer is ground to reduce the thickness of the semiconductor wafer to a desired value. Then, a rear surface electrode is formed on the ground rear surface of the semiconductor wafer (for example, see the following Patent Document 10).

CITATION LIST

Patent Document

Patent Document 1: JP 2007-036211 A
Patent Document 2: JP 2002-110893 A
Patent Document 3: JP 2003-110064 A
Patent Document 4: Japanese Patent No. 4344560
Patent Document 5: JP 2005-353960 A
Patent Document 6: Japanese Patent No. 3823974
Patent Document 7: Japanese Patent No. 3829860
Patent Document 8: Japanese Patent No. 4049035
Patent Document 9: JP 2007-027477 A
Patent Document 10: JP 2006-261415 A Non-Patent Document Non-Patent Document 1: Denkimekki Kenkyukai, "Electroless Plating Fundamentals and Applications," Nikkan Kogyo Shimbun, Ltd., May 1994, pp. 36 and 37

Non-Patent Document 2: DISCO Corporation, "TAIKO Process", [online], 2001 to 2013, Internet, [Searched in Sep. 9, 2013]

DISCLOSURE OF THE INVENTION

Problem to be Solved by the Invention

However, the inventors conducted a thorough study on the above-mentioned techniques and newly found the following problems. FIG. 22 is a cross-sectional view illustrating the state of the semiconductor device according to the related art after the plating process during manufacture. When the rear surface electrode 103 is formed on the rear surface of the semiconductor wafer 100 by a physical vapor deposition method such as a sputtering method, there is a concern that the rear surface electrode 103 will be formed so as to extend from the outer circumferential portion to the front surface of the semiconductor wafer 100, as illustrated in FIG. 19. In this case, the end 103a of the rear surface electrode 103 extends onto the protective film 102 in the outer circumferential portion of the front surface of the semiconductor wafer. The rear surface electrode 103 is formed so as to extend from the outer circumferential portion to the front surface of the semiconductor wafer 100 due to the structure of a sputtering apparatus.

The sputtering method uses a target that has a larger diameter than the semiconductor wafer 100, as compared to a general vapor deposition method using an electron beam. In addition, the sputtering method uses an argon (Ar) atmosphere in which the mean free path of metal atoms emitted from the target is relatively short. The extension of the rear surface electrode 103 to the front surface of the wafer is caused by the structure of the sputtering apparatus. In addition, the thinned semiconductor wafer 100 warps such that the front surface is convex. Therefore, during the formation of the rear surface electrode 103, when it is difficult to correct the warping of the semiconductor wafer 100 due to, for example, electrostatic chuck, there is a concern that the extension of the rear surface electrode 103 to the front surface of the wafer will be accelerated.

When the rear surface electrode 103 is formed so as to extend to the front surface of the wafer, the end 103a of the rear surface electrode 103 is exposed in the method which protects the rear surface electrode 103 formed on the rear surface of the wafer with the supporting substrate 104, as illustrated in FIG. 20. Therefore, as illustrated in FIG. 21, when the plated film 105 is formed on the front surface electrode 101, a plated film 105a is also deposited on the exposed end 103a of the rear surface electrode 103. As illustrated in FIG. 22, it was found that the plated film 105a deposited on the end 103a of the rear surface electrode 103 peeled from the end 103a of the rear surface electrode 103 during the plating process or after the plating process. The reason is as follows.

In the rear surface electrode 103, a portion on the rear surface of the wafer and a portion (end 103a) on the outer circumference of the wafer basically have the same laminated structure. However, in each metal layer forming the rear surface electrode 103, the thickness of the portion on the outer circumference of the wafer is less than the thickness of the portion on the rear surface of the wafer. Therefore, the outermost layer (for example, the gold layer) of the end 103 of the rear surface electrode 103 is etched by preprocessing of the electroless plating process for forming the plated film 105 on the front surface electrode 101 and the nickel layer below the outermost layer is exposed. When the plating process is performed in this state, a nickel plated film (plated film 105a) is grown on the exposed portion of the nickel layer. Since the adhesion between the rear surface electrode 103 which extends to the front surface and the base of the rear surface electrode 103 is low, the nickel plated film is peeled off due to the internal stress of the nickel plated film after the plating process. Here, the base of the rear surface electrode 103 is, for example, the protective film 102 or an oxide film (not illustrated) on the semiconductor wafer 100.

When the peeled plated film 105a falls into a plating tank, the peeled plated film 105a becomes a crystal nucleus in the plating process and causes abnormal deposition in the plating tank. When abnormal deposition occurs in the plating tank, for example, a change in the composition of a plating solution, for example, a reduction in the concentration of nickel, which is a main component of the plating solution, occurs, which makes it difficult to continuously perform a normal plating process. Therefore, it is difficult to form the plated film 105 with a predetermined thickness. In addition, in some cases, the peeled plated film 105a is reattached to the surface of the semiconductor wafer 100 during the plating process or during a dicing process after the plating process. In this case, the reattached plated film 105a causes chip defects, such as poor appearance or a short circuit between wiring lines, which results in a reduction in yield.

The invention has been made in order to solve the above-mentioned problems of the related art and an object of the invention is to provide a method for manufacturing a semiconductor device with high yield.

Means for Solving Problem

In order to solve the above-mentioned problems and achieve the object of the invention, according to an aspect of the invention, there is provided a method for manufacturing a semiconductor device including a semiconductor chip which has a front surface electrode and a rear surface electrode provided on a front surface and a rear surface, respectively. The method has the following characteristics. First, a front surface electrode layer forming step of forming a front surface electrode layer as the front surface electrode on a front surface of a semiconductor wafer which will be the semiconductor chip is performed. Then, a thinning step of grinding a rear surface of the semiconductor wafer to reduce the thickness of the semiconductor wafer is performed after the front surface electrode layer forming step. Then, a plating step of forming an electrode plating film as the front surface electrode on a surface of the front surface electrode layer is performed after the thinning step. Then, a rear surface electrode forming step of forming the rear surface electrode on the ground rear surface of the semiconductor wafer is performed after the plating step.

Effect of the Invention

According to the method for manufacturing the semiconductor device of the invention, it is possible to manufacture a semiconductor device with high yield.

MODE(S) FOR CARRYING OUT THE INVENTION

Figure 1:
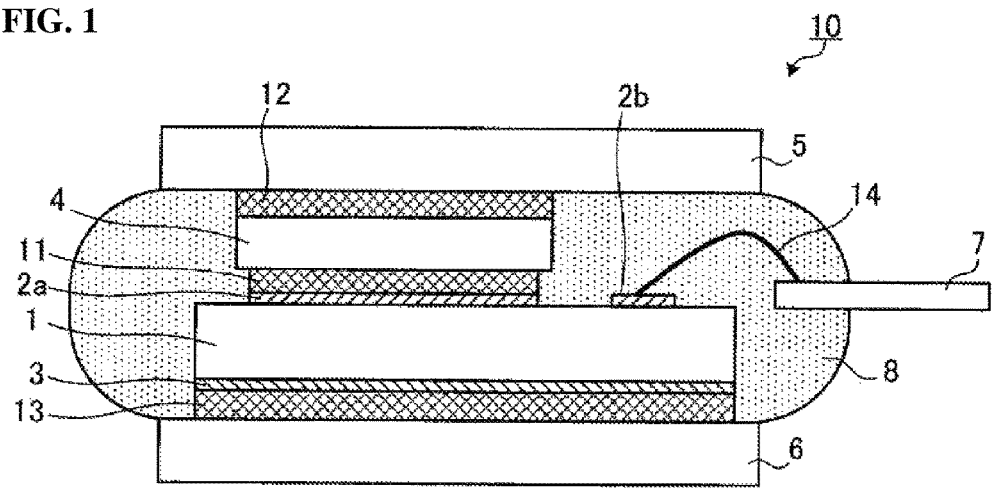
FIG. 1 is a cross-sectional view illustrating the structure of a semiconductor device according to a first embodiment.

Hereinafter, preferred embodiments of a method for manufacturing a semiconductor device according to the invention will be described in detail with reference to the accompanying drawings. In the following description of the embodiments and the drawings, the same components are denoted by the same reference numerals and the description thereof will not be repeated.

(First Embodiment)

The structure of a semiconductor device manufactured by a semiconductor device manufacturing method according to a first embodiment will be described. FIG. 1 is a cross-sectional view illustrating the structure of the semiconductor device according to the first embodiment. As illustrated in FIG. 1, a semiconductor device 10 according to the first embodiment has a structure in which a semiconductor chip 1 is provided in a package. The semiconductor chip 1 is, for example, a vertical semiconductor element such as an IGBT. The thickness of the semiconductor chip 1 is, for example, equal to or greater than 30 μm and equal to or less than 250 μm and preferably equal to or greater than 30 μm and equal to or less than 140 μm. The reason is as follows. Since the resistance of a drift region can be reduced, it is possible to improve the trade-off relationship between a saturation voltage Vice (sat) and a turn-off loss Eoff. In addition, since the radiation performance of the element is improved, it is possible to improve heat resistance.

Hereinafter, the structure of the semiconductor device 10 will be described in detail, using an example in which an IGBT is applied to the semiconductor chip 1. A first front surface electrode 2a which will be an emitter electrode and a second front surface electrode 2b which will be a gate pad, a current detection pad, or a temperature detection pad are provided on the front surface of the semiconductor chip 1. The first and second front surface electrodes 2a and 2b are formed by sequentially laminating, for example, an aluminum silicon layer, a nickel (Ni)-phosphorus (P) plated film, and a gold (Au) plated film on the semiconductor chip 1. The aluminum silicon layer is made of, for example, aluminum including about 1 wt % of silicon. The nickel-phosphorus plated film has a function of improving adhesion to a solder layer which will be described below. It is preferable that the nickel-phosphorus plated film include, for example, about 2 wt % to 10 wt % of phosphorus. The reason is that, in general, a nickel plating bath is stable, nickel plating characteristics are good, a deposition speed is high, and soldering characteristics are good. The thickness of the nickel-phosphorus plated film may be, for example, equal to or greater than 3 μm and equal to or less than 6 μm, considering the amount of nickel and phosphorus melted in a solder layer during soldering. The gold plated film has a function of preventing the oxidation of the nickel-phosphorus plated film. The thickness of the gold plated film may be, for example, about 0.03 μm.

A rear surface electrode 3 which will be a collector electrode is provided on the rear surface of the semiconductor chip 1. The rear surface electrode 3 is formed by sequentially laminating, for example, an aluminum silicon layer, a titanium (Ti) layer, a nickel layer, and a gold layer on the semiconductor chip 1. The titanium layer functions as a buffer layer that prevents nickel atoms in the nickel layer from being diffused into the aluminum silicon layer. The nickel layer has a function of improving adhesion to a solder layer which will be described below. The gold layer has a function of preventing the oxidation of the nickel layer. The thickness of the aluminum silicon layer, the titanium layer, the nickel layer, and the gold layer may be, for example, 0.5 μm, 0.2 μm, 0.7 μm, and 0.05 μm, respectively. In addition, a silver (Ag) layer with a thickness that is equal to or greater than 0.5 μm and equal to or less than 1 μm may be used instead of the gold layer.

The first front surface electrode 2a of the semiconductor chip 1 is bonded to a rear surface of a first metal plate 4, with a solder layer 11 interposed therebetween. A front surface of the first metal plate 4 is bonded to a rear surface of a second metal plate 5, with a solder layer 12 interposed therebetween. The rear surface electrode 3 of the semiconductor chip 1 is bonded to a front surface of a third metal plate 6, with a solder layer 13 interposed therebetween. The second front surface electrode 2b of the semiconductor chip 1 is electrically connected to a fourth metal plate 7 for connection to, for example, an external apparatus (not illustrated) through a bonding wire 14. For example, a wire made of aluminum or gold may be used as the bonding wire 14. Each member interposed between the second metal plate 5 and the third metal plate 6 is sealed with a resin 8. That is, substantially the entire semiconductor device 10 is sealed.

The first and second metal plates 4 and 5 and the first front surface electrode 2a of the semiconductor chip 1 form an emitter electrode. The third metal plate 6 and the second front surface electrode 2b of the semiconductor chip 1 form a collector electrode. The first to third metal plates 4 to 6 are made of a material with high thermal conductivity and function as radiators that dissipate heat generated from the semiconductor chip 1. Specifically, for example, a copper (Cu) plate whose surface is covered with a plated film including a nickel-phosphorus plated film and a gold plated film which are sequentially formed by an electroless plating process may be used as the first to third metal plates 4 to 6. The solder layers 11 to 13 may be lead-free solder without including lead (Pb), such as tin (Sn)-silver-copper-based solder or tin-nickel-copper-based solder. The thickness of the solder layers 11, 12, and 13 may be, for example, equal to or less than 100 μm such that the thermal resistance of the solder layers in the semiconductor device 10 does not increase.

Figure 2:
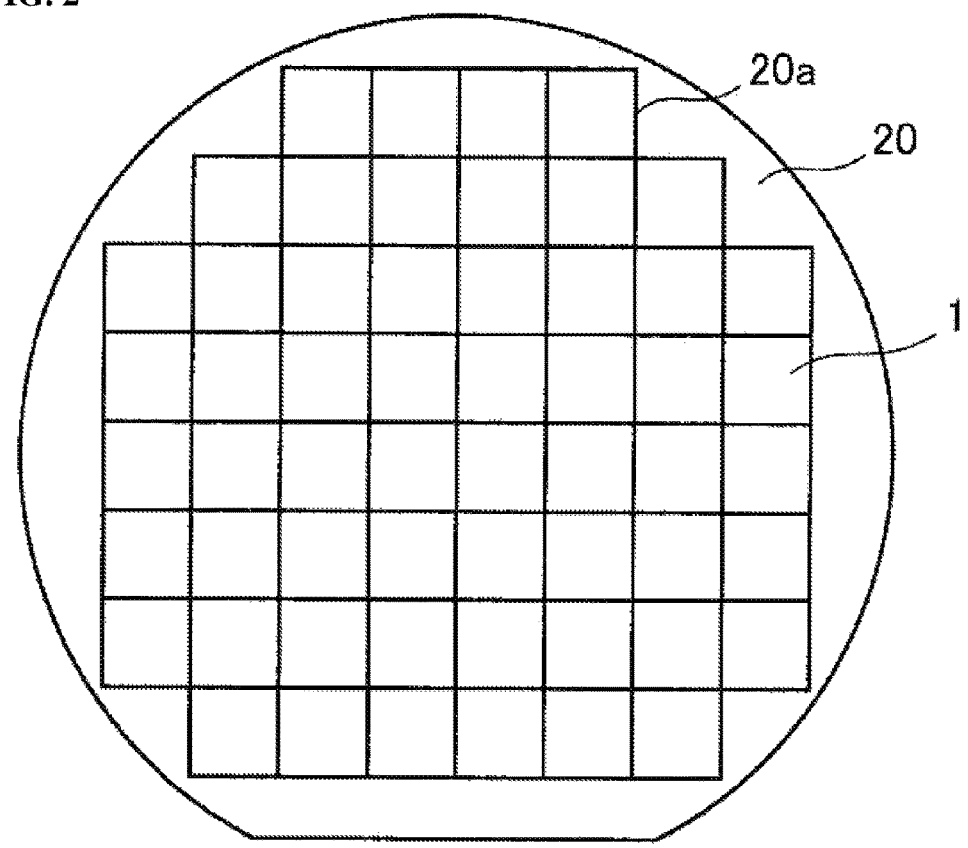
FIG. 2 is a plan view illustrating the state of a semiconductor wafer while the semiconductor device according to the first embodiment is being manufactured.

Next, the state of a semiconductor wafer before the semiconductor chip 1 provided in the semiconductor device 10 with the above-mentioned package structure is diced will be described. FIG. 2 is a plan view illustrating the state of the semiconductor wafer while the semiconductor device according to the first embodiment is being manufactured. As illustrated in FIG. 2, during the manufacture of the semiconductor device according to the first embodiment, in the semiconductor wafer 20, a semiconductor element (not illustrated), such as an IGBT, is formed in each region which becomes the semiconductor chip 1 when the semiconductor wafer 20 is diced into the individual semiconductor chips 1. The regions which become the semiconductor chips 1 after the semiconductor wafer 20 is diced are arranged in, for example, a lattice shape. A dicing line 20a is arranged between the regions which become the semiconductor chips 1 after the semiconductor wafer is diced.

Figure 3:
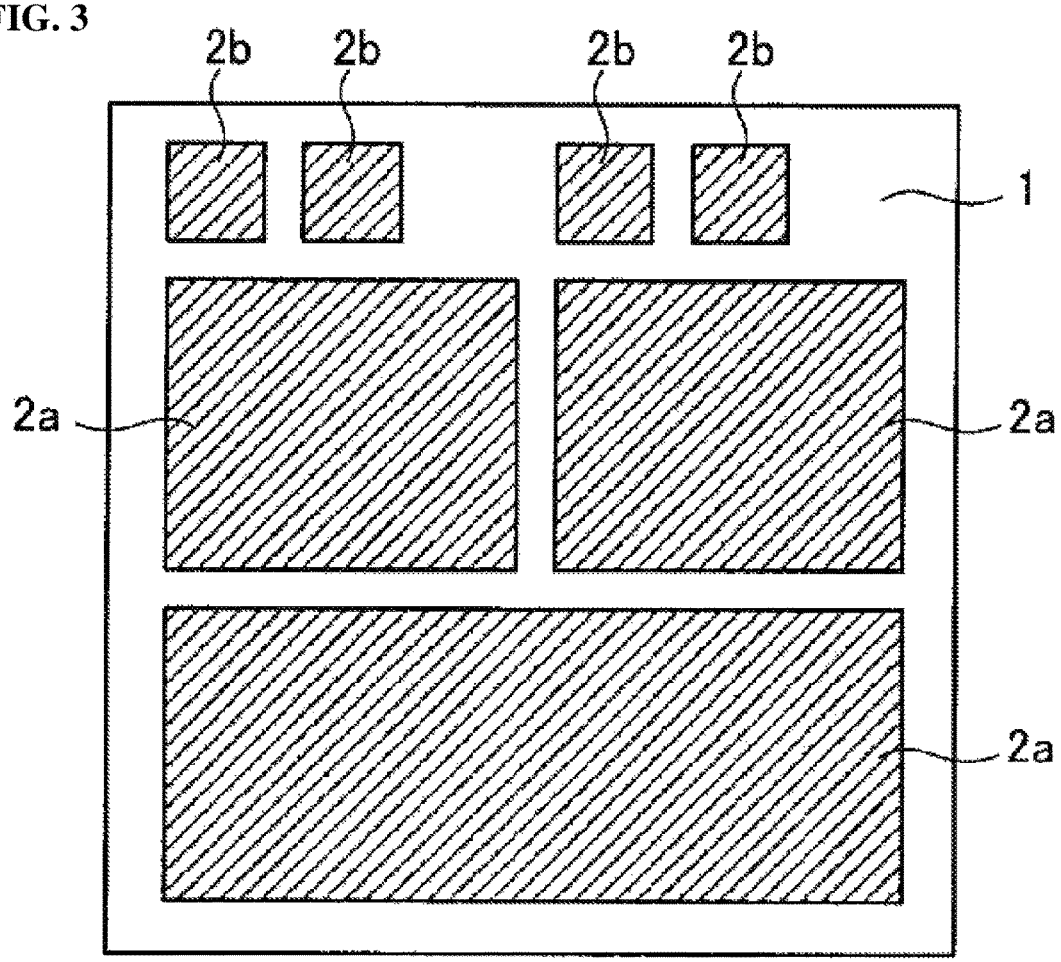
FIG. 3 is a plan view illustrating the planar layout of a front surface electrode of a semiconductor chip illustrated in FIG. 1.

Next, the planar layout of the first and second front surface electrodes 2a and 2b on the front surface of the semiconductor chip 1 will be described. FIG. 3 is a plan view illustrating the planar layout of the front surface electrodes of the semiconductor chip illustrated in FIG. 1. As illustrated in FIG. 3, a plurality of first front surface electrodes 2a and a plurality of second front surface electrodes 2b are provided on the front surface of the semiconductor chip 1. The first and second front surface electrodes 2a and 2b have, for example, a substantially rectangular shape in a plan view. The occupation area of the first front surface electrode 2a is larger than the occupation area of the second front surface electrode 2b. For example, the second front surface electrodes 2b are arranged in parallel along the outer circumference of the semiconductor chip 1. In addition to the first and second front surface electrodes 2a and 2b, other electrodes may be provided on the front surface of the semiconductor chip 1. In FIG. 3, a portion other than the first and second front surface electrodes 2a and 2b on the semiconductor chip 1 is a protective film which is made of an insulating material such as polyimide.

Figure 4:
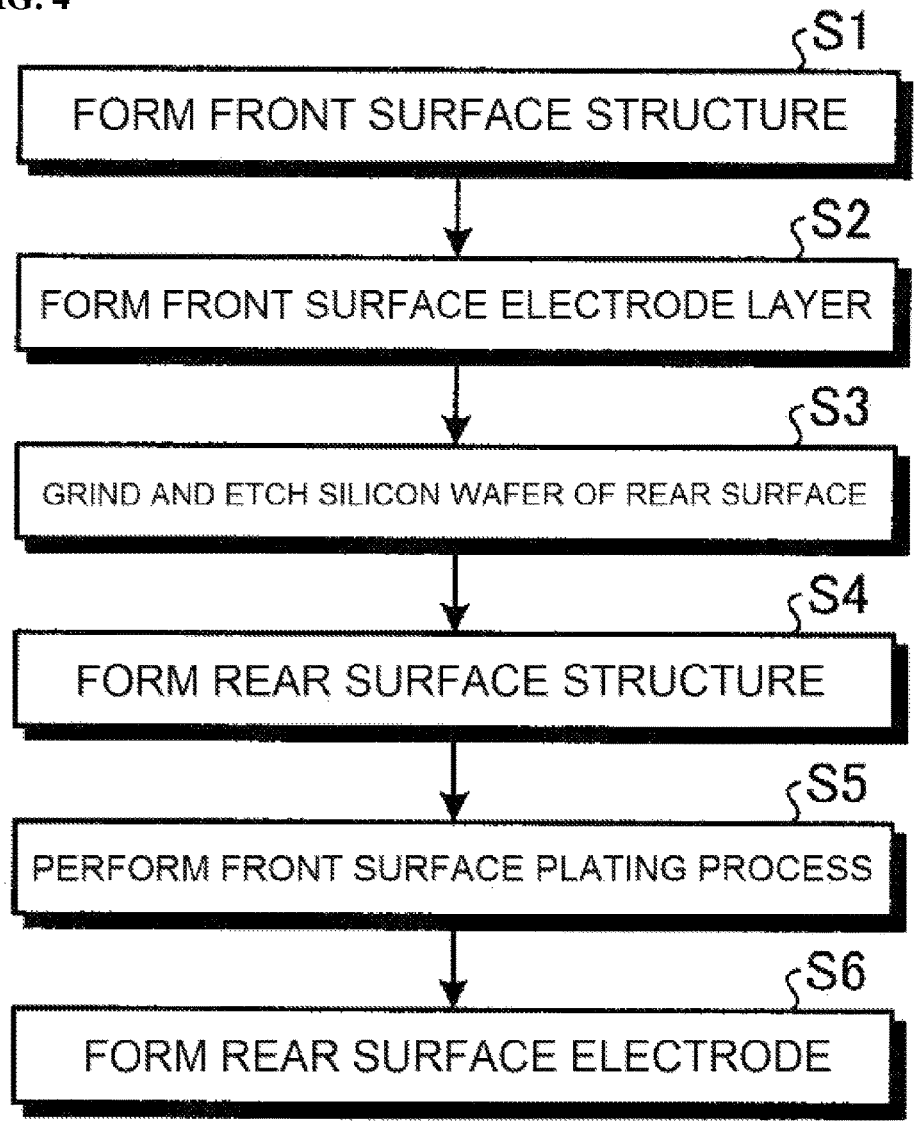
FIG. 4 is a flowchart illustrating a method for manufacturing the semiconductor device according to the first embodiment.

Next, an example in which the semiconductor device 10 with the above-mentioned package structure is manufactured by the semiconductor device manufacturing method according to the first embodiment will be described. FIG. 4 is a flowchart illustrating the semiconductor device manufacturing method according to the first embodiment. FIGS. 5 to 10 are cross-sectional views illustrating the state of the semiconductor device according to the first embodiment during manufacture. First, for example, a semiconductor wafer 20, which has a diameter of 6 inches (≈150 mm) and a thickness of 600 μm and is made of silicon, is prepared. Then, a front surface structure (not illustrated) of a general IGBT including, for example, a gate region and an emitter region is formed in a surface layer of the front surface of the semiconductor wafer 20 by a general method (Step S1). The front surface structure is formed in each region which becomes the semiconductor chip 1 after dicing.

Figure 5:
FIG. 5 is a cross-sectional view illustrating the state of the semiconductor device according to the first embodiment during manufacture.
Figure 6:
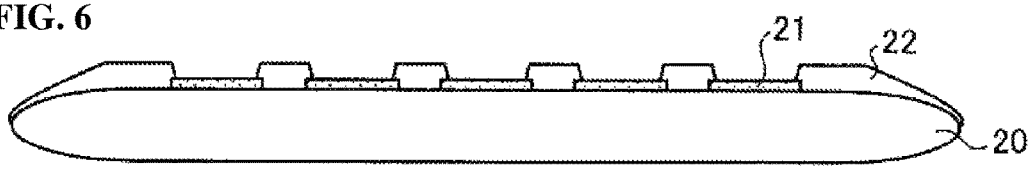
FIG. 6 is a cross-sectional view illustrating the state of the semiconductor device according to the first embodiment during manufacture.

Then, a front surface electrode layer 21 which is made of, for example, aluminum silicon is formed on the front surface of the semiconductor wafer 20 by, for example, a sputtering method. Then, as illustrated in FIG. 5, the front surface electrode layer 21 is patterned (Step S2). Then, a protective film 22 which is made of an insulating material, such as polyimide, is formed on the entire front surface of the semiconductor wafer 20 by, for example, a spin coater. Then, as illustrated in FIG. 6, the protective film 22 is patterned by photolithography such that a portion of the protective film 22 on the front surface electrode layer 21 is removed and an opening portion through which the front surface electrode layer 21 is exposed is formed.

In this case, it is preferable to form and pattern the protective film 22 such that the protective film 22 remains in an outer circumferential portion of the semiconductor wafer 20. The reason is as follows. During a plating process which will be described below, when a silicon portion or an etching residue of the front surface electrode layer 21 is exposed without being covered with the protective film 22, there is a concern that a plated film will be deposited on the outer circumferential portion of the semiconductor wafer 20 and will be peeled off during the plating process or after the plating process. The peeled plated film is likely to cause the problems of the related art.

Figure 7:
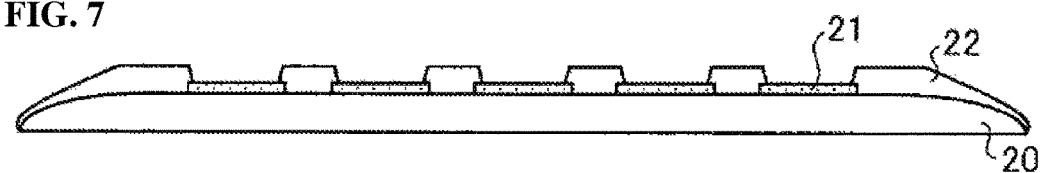
FIG. 7 is a cross-sectional view illustrating the state of the semiconductor device according to the first embodiment during manufacture.

Then, as illustrated in FIG. 7, the rear surface of the semiconductor wafer 20 is ground by a general grinding device (back grinding). In addition, the rear surface of the semiconductor wafer 20 is etched to remove a damage layer which is generated by the grinding process. The semiconductor wafer 20 is thinned to the thickness of the semiconductor chip 1 by the grinding and etching processes (Step S3). Then, a rear surface structure (not illustrated) including, for example, a collector region is formed in a surface layer of the ground rear surface of the semiconductor wafer 20 by a general method (for example, ion implantation and thermal diffusion) (Step S4).

In Step S4, for example, p-type impurity ions, such as boron (B) ions, are implanted under the conditions of an acceleration energy of 50 keV and a dose of $1 \times 10^{15}$ cm$^{-2}$ and the implanted p-type impurity ions are thermally diffused to form a p-type collector region in the n-type semiconductor chip 1. In addition, n-type impurity ions, such as phosphorus ions or protons (H$^+$), may be implanted and the implanted n-type impurity ions may be thermally diffused to form an n-type field stop region in the rear surface of the n-type semiconductor chip 1. The n-type field stop region has a function of preventing a depletion layer, which is spread from the pn junction between a base region and drift region when the semiconductor device is turned off, from reaching the collector region. A heat treatment for thermally diffusing the implanted impurity ions may be performed at a temperature of, for example, 300° C. or more.

Figure 8:
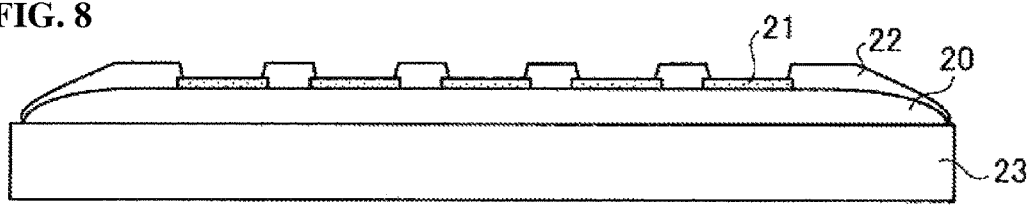
FIG. 8 is a cross-sectional view illustrating the state of the semiconductor device according to the first embodiment during manufacture.
Figure 9:
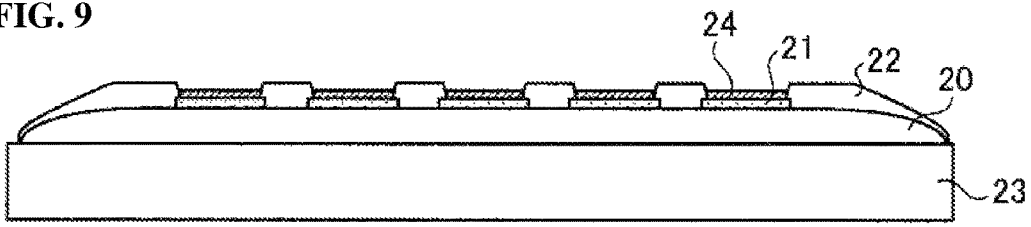
FIG. 9 is a cross-sectional view illustrating the state of the semiconductor device according to the first embodiment during manufacture.

Then, as illustrated in FIG. 8, a supporting substrate 23 is bonded to the rear surface of the semiconductor wafer 20 to protect the rear surface (that is, the silicon portion) of the semiconductor wafer 20. The supporting substrate 23 is used to prevent a plated film from being deposited on the rear surface of the semiconductor wafer 20 during the plating process which will be described below. Therefore, the following process may be performed on the supporting substrate 23: glass is bonded to the supporting substrate 23 by an adhesive; an adhesive tape is bonded to the supporting substrate 23; a thermosetting resin which is resistant to a plating solution is applied by the spin coater and a heat treatment is performed to harden the thermosetting resin; or a ultraviolet curable resin which is resistant to a plating solution is applied by the spin coater and ultraviolet rays are radiated to harden the resin. Then, as illustrated in FIG. 9, for example, a plurality of plated films is sequentially formed on the surface of the front surface electrode layer 21 by an electroless plating process to form an electrode plating film 24 (Step S5).

In Step S5, as described above, for example, a nickel-phosphorus plated film and a gold plated film are sequentially laminated as the electrode plating film 24. The nickel-phosphorus plated film may be formed using a plating solution which is maintained at a bath temperature that is, for example, equal to or more than 75° C. and equal to or less than 85° C. The reason is as follows. Since an electroless nickel plating process is characterized in that a plating precipitation speed exponentially increases with an increase in temperature, the deposition speed is high and it is preferable to perform the plating process at a bath temperature that is equal to or more than 75° C. and equal to or less than 85° C. at which the plating solution is not decomposed. Preprocessing (for example, a zincate process) for improving the adhesion between the front surface electrode layer 21 and the electrode plating film 24 may be performed before the plating process for forming the electrode plating film 24.

As illustrated in FIG. 1, the electrode plating film 24 on the front surface electrode layer 21 which will be the first front surface electrode 2a is used for soldering. The electrode plating film 24 on the front surface electrode layer 21 which will be described the second front surface electrode 2b is used for wire bonding.

Figure 10:
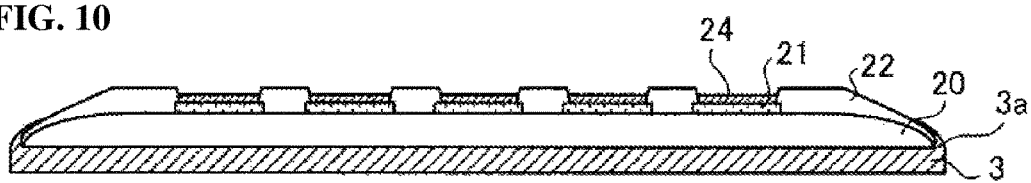
FIG. 10 is a cross-sectional view illustrating the state of the semiconductor device according to the first embodiment during manufacture.

Then, the supporting substrate 23 is removed from the rear surface of the semiconductor wafer 20. Then, as illustrated in FIG. 10, a plurality of metal layers is sequentially formed on the rear surface of the semiconductor wafer 20 by a physical vapor deposition method, such as a sputtering method, to form the rear surface electrode 3 (Step S6). In Step S6, as described above, for example, an aluminum silicon layer, a titanium layer, a nickel layer, and a gold layer are sequentially formed as the rear surface electrode 3. In Step S6, since the physical vapor deposition method is used, the rear surface electrode 3 is formed such that the end 3a thereof extends from the outer circumferential portion to the front surface of the semiconductor wafer 20. However, since the plating process is not performed after the rear surface electrode 3 is formed, the plated film is not deposited on the end 3a of the rear surface electrode 3.

Then, for example, a heat treatment is performed at a temperature of 350° C. to form an ohmic contact between the rear surface electrode 3 and the silicon portion of the semiconductor wafer 20, thereby reducing the contact resistance of the rear surface electrode 3. Then, the semiconductor wafer 20 is diced along the dicing lines 20a. In this way, the semiconductor chip 1 provided in the semiconductor device 10 illustrated in FIG. 1 is completed.

Then, each member is soldered by a general method such that the semiconductor chip 1 and the first to third metal plates 4 to 6 are arranged at predetermined positions. Then, the fourth metal plate 7 is connected to the electrode plating film 24 which will be the second front surface electrode 2b of the semiconductor chip 1 through the bonding wire 14. Then, at least the entire semiconductor chip 1 is sealed by a resin 8. In this way, the semiconductor device 10 with the package structure illustrated in FIG. 1 is completed.

(Second Embodiment)

Figure 11:
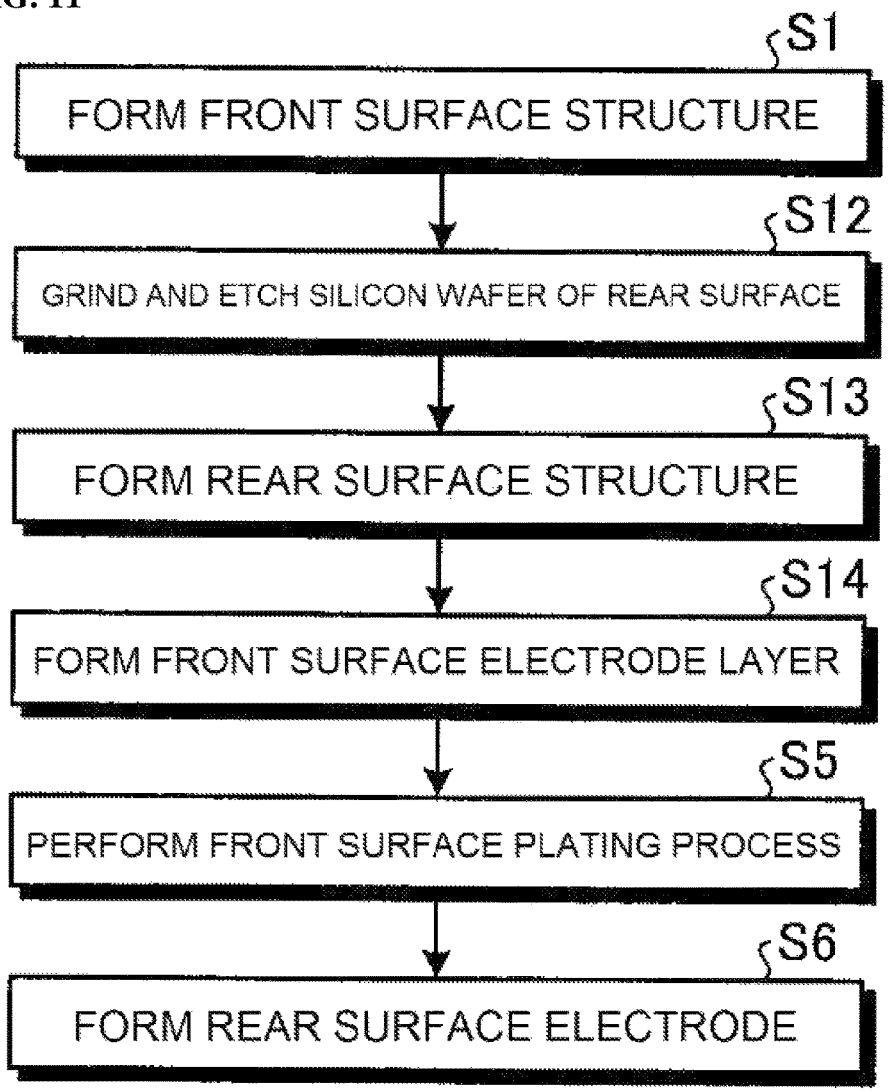
FIG. 11 is a flowchart illustrating a method for manufacturing a semiconductor device according to a second embodiment.
Figure 12:
FIG. 12 is a cross-sectional view illustrating the state of the semiconductor device according to the second embodiment during manufacture.
Figure 13:
FIG. 13 is a cross-sectional view illustrating the state of the semiconductor device according to the second embodiment during manufacture.
Figure 14:
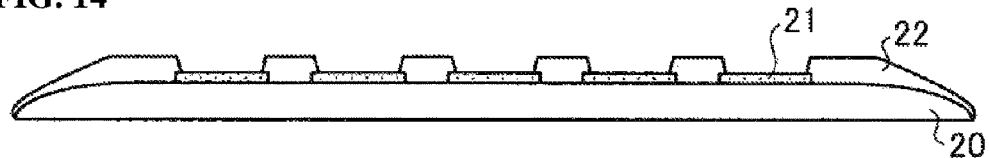
FIG. 14 is a cross-sectional view illustrating the state of the semiconductor device according to the second embodiment during manufacture.
Figure 15:
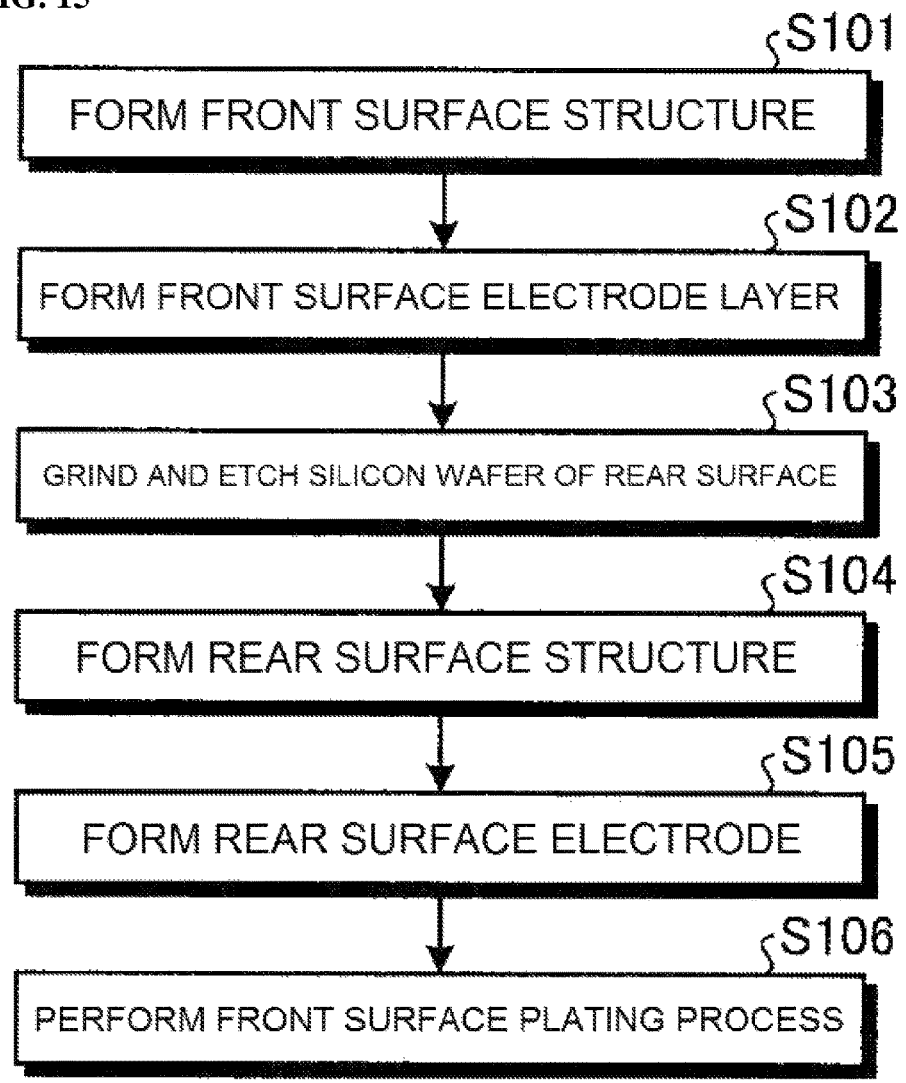
FIG. 15 is a flowchart illustrating a method for manufacturing a semiconductor device according to the related art.
Figure 16:
FIG. 16 is a cross-sectional view illustrating the state of the semiconductor device according to the related art during manufacture.
Figure 17:
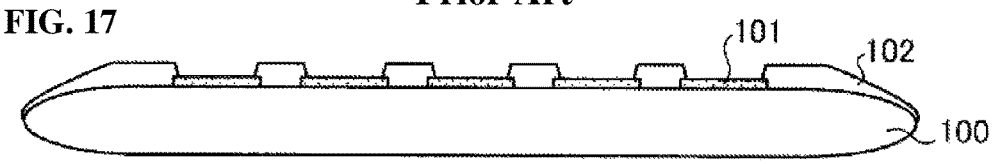
FIG. 17 is a cross-sectional view illustrating the state of the semiconductor device according to the related art during manufacture.
Figure 18:
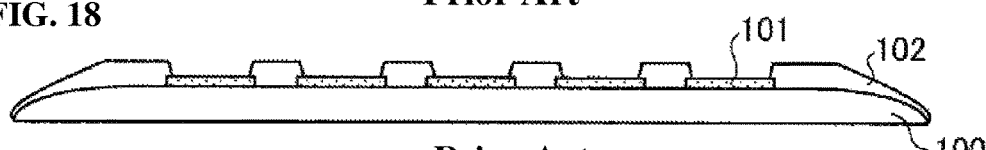
FIG. 18 is a cross-sectional view illustrating the state of the semiconductor device according to the related art during manufacture.
Figure 19:
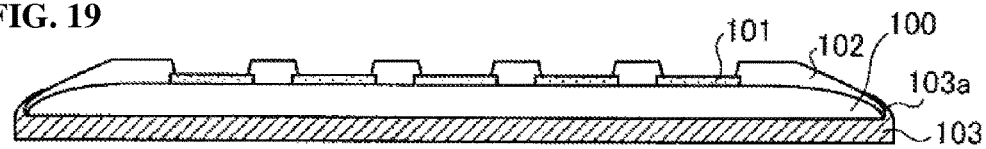
FIG. 19 is a cross-sectional view illustrating the state of the semiconductor device according to the related art during manufacture.
Figure 20:
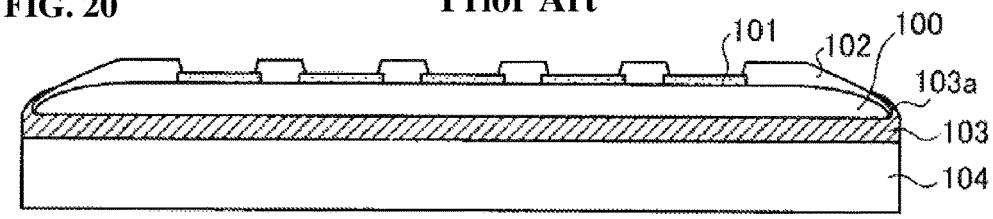
FIG. 20 is a cross-sectional view illustrating the state of the semiconductor device according to the related art during manufacture.
Figure 21:
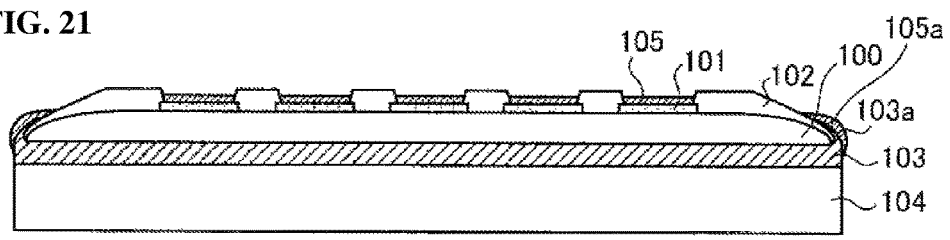
FIG. 21 is a cross-sectional view illustrating the state of the semiconductor device according to the related art during manufacture.
Figure 22:
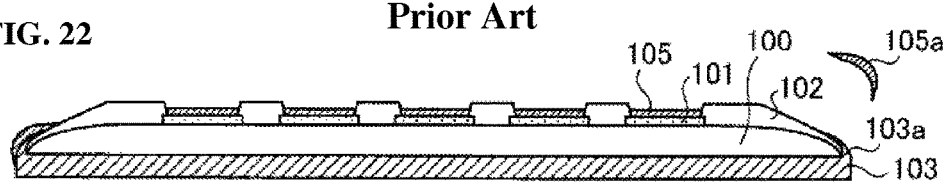
FIG. 22 is a cross-sectional view illustrating the state of the semiconductor device according to the related art after a plating process during manufacture.

An example in which the semiconductor device 10 with the above-mentioned package structure is manufactured by a semiconductor device manufacturing method according to a second embodiment will be described. FIG. 11 is a flowchart illustrating the semiconductor device manufacturing method according to the second embodiment. FIGS. 12 to 14 are cross-sectional views illustrating the state of a semiconductor device according to the second embodiment during manufacture. In the following second embodiment, the same components as those in the first embodiment are denoted by the same reference numerals and the description thereof will not be repeated.

First, a semiconductor wafer 20 which is made of silicon is prepared. Then, as illustrated in FIG. 12, a front surface structure (not illustrated) of a general IGBT is formed in a surface layer of a front surface of the semiconductor wafer 20 by a general method (Step S1).

Then, a rear surface of the semiconductor wafer 20 is ground by a general grinding apparatus (back grinding). In addition, as illustrated in FIG. 13, the rear surface of the semiconductor wafer 20 is etched to remove a damage layer which is generated by the grinding process. The semiconductor wafer 20 is thinned to the thickness of the semiconductor chip 1 by the grinding and etching processes (Step S12).

Then, a rear surface structure (not illustrated) including, for example, a collector region is formed in a surface layer of the ground rear surface of the semiconductor wafer 20 by a general method (for example, ion implantation and thermal diffusion) (Step S13). In Step S13, for example, p-type impurity ions, such as boron (B) ions, are implanted under the conditions of an acceleration energy of 50 keV and a dose of $1\times10^{15}$ cm$^{-2}$ and the implanted p-type impurity ions are thermally diffused to form a p-type collector region in the n-type semiconductor chip 1. A heat treatment for thermally diffusing the implanted impurity ions may be performed at a temperature of 300° C. or more.

Then, a front surface electrode layer 21 is formed on the front surface of the semiconductor wafer 20 by, for example, a sputtering method. Then, the front surface electrode layer 21 is patterned. Then, for example, a protective film 22 is formed on the entire front surface of the semiconductor wafer 20 by the spin coater. Then, as illustrated in FIG. 14, the protective film 22 is patterned by photolithography such that a portion of the protective film 22 on the front surface electrode layer 21 is removed and an opening portion through which the front surface (Step S14).

Then, a supporting substrate 23 is bonded to the rear surface of the semiconductor wafer 20 to protect the rear surface (that is, the silicon portion) of the semiconductor wafer 20.

Then, as illustrated in FIG. 9, a plurality of plated films is sequentially formed on the surface of the front surface electrode layer 21 to form an electrode plating film 24 (Step S5). In Step S5, as described above, for example, a nickel-phosphorus plated film and a gold plated film are sequentially formed as the electrode plating film 24.

Then, the supporting substrate 23 is removed from the rear surface of the semiconductor wafer 20. Then, as illustrated in FIG. 10, a plurality of metal layers is sequentially formed on the rear surface of the semiconductor wafer 20 by a physical vapor deposition method, such as a sputtering method, to form a rear surface electrode 3 (Step S6). In Step S6, as described above, for example, an aluminum silicon layer, a titanium layer, a nickel layer, and a gold layer are sequentially formed as the rear surface electrode 3. In Step S6, since the physical vapor deposition method is used, the rear surface electrode 3 is formed such that the end 3a thereof extends from the outer circumferential portion to the front surface of the semiconductor wafer 20. However, since the plating process is not performed after the rear surface electrode 3 is formed, the plated film is not deposited on the end 3a of the rear surface electrode 3.

Then, for example, a heat treatment is performed at a temperature of 350° C. to form an ohmic contact between the rear surface electrode 3 and the silicon portion of the semiconductor wafer 20, thereby reducing the contact resistance of the rear surface electrode 3. Then, the semiconductor wafer 20 is diced along the dicing lines 20a. In this way, the semiconductor chip 1 provided in the semiconductor device 10 illustrated in FIG. 1 is completed.

As described above, according to the embodiment, after the electrode plating film is formed on the front surface electrode layer on the front surface of the wafer, the rear surface electrode is formed on the rear surface of the wafer. Therefore, even when the end of the rear surface electrode extends to the protective film in the outer circumferential portion of the front surface of the wafer, the plated film is not deposited on the end of the rear surface electrode in the outer circumferential portion of the wafer. Therefore, the plated film is not peeled from the end of the semiconductor wafer during the plating process or after the plating process, unlike the related art. As a result, it is possible to prevent abnormal deposition in a plating tank which is caused by the peeled plated film. In addition, it is possible to prevent the occurrence of chip defects due to the reattachment of the peeled plated film to the semiconductor wafer. Therefore, it is possible to improve the yield of the semiconductor chip.

According to this embodiment, after the rear surface structure is formed on the rear surface side of the wafer, the electrode plating film is formed on the front surface electrode layer on the front surface of the wafer. Therefore, it is possible to prevent the electrode plating film from being broken by the heat treatment (the thermal diffusion of impurities) for forming the rear surface structure.

In addition, according to the second embodiment, after the rear surface structure is formed on the rear surface side of the wafer, the front surface electrode layer is formed on the front surface of the wafer. Therefore, even when the front surface electrode is made of aluminum or an aluminum alloy, the heat treatment for thermally diffusing the implanted impurity ions can be performed at a temperature that is more than the melting point of the electrode. For example, when selenium (Se) ions are implanted, the temperature of the heat treatment temperature for thermal diffusion is about 900° C. that is more than the melting point (660° C.) of aluminum. According to the second embodiment, in this case, it is possible to obtain the effect of improving yield.

As described above, in the invention, the IGBT is given as an example of the semiconductor element formed in the semiconductor chip. However, the invention is not limited to the above-described embodiments. For example, the invention can be applied to a case in which a plated film is formed on the surface of the electrode in various semiconductor elements such as a MOSFET and a free wheeling diode (FWD). In addition, in the above-described embodiments, a 6-inch semiconductor wafer is used. However, the invention is not limited to this. For example, semiconductor wafers with various diameters, such 4 inches, 8 inches, and 12 inches, can be used. In addition, the material forming the semiconductor wafer is not limited to silicon. For example, various semiconductor materials, such as silicon carbide (SiC) and gallium nitride (GaN), may be used.

In the above-described embodiments, the examples are described in a state in which the rear surface of the semiconductor wafer is ground uniformly. However, for example, as disclosed in the above-mentioned Non-Patent Document 2, the invention can be applied to a semiconductor wafer in which only a central portion of the rear surface is ground and an outer circumferential portion has a rib portion that is thick in a predetermined width range. In addition, the arrangement of the first and second front surface electrodes on the front surface of the chip is an illustrative example and can be changed in various ways, depending on the structure of the semiconductor element formed in the semiconductor chip.

INDUSTRIAL APPLICABILITY

As described above, the semiconductor device manufacturing method according to the invention is useful to manufacture a semiconductor device mounted with a thin semiconductor chip and is particularly suitable to manufacture a power semiconductor device, such as an IGBT, which is used in, for example, a general-purpose inverter, an AC servo system, an uninterruptible power supply (UPS), a switching power supply, and a DC-DC step-up converter for a hybrid vehicle.

EXPLANATIONS OF LETTERS OR NUMERALS

1 SEMICONDUCTOR CHIP
2a FIRST FRONT SURFACE ELECTRODE
2b SECOND FRONT SURFACE ELECTRODE
3 REAR SURFACE ELECTRODE
3a END OF REAR SURFACE ELECTRODE
4 FIRST METAL PLATE
5 SECOND METAL PLATE
6 THIRD METAL PLATE
7 FOURTH METAL PLATE
8 RESIN
10 SEMICONDUCTOR DEVICE
11, 12, 13 SOLDER LAYER
14 BONDING WIRE
20 SEMICONDUCTOR WAFER
20a DICING LINE
21 FRONT SURFACE ELECTRODE LAYER
22 PROTECTIVE FILM

23 SUPPORTING SUBSTRATE
24 ELECTRODE PLATING FILM

What is claimed is:

1. A method for manufacturing a semiconductor device including a semiconductor chip having a front surface electrode and a rear surface electrode provided on a front surface and a rear surface, respectively, the method comprising:
   a front surface electrode layer forming step of forming a front surface electrode layer as the front surface electrode on a front surface of a semiconductor wafer forming the semiconductor chip;
   a protective film forming step of forming a protective film on the front surface of the semiconductor wafer such that a portion of the protective film exposes the front surface electrode layer and the protective film is retained on an outer circumferential portion of the semiconductor wafer after the front surface electrode layer forming step;
   a thinning step of grinding a rear surface of the semiconductor wafer to reduce a thickness of the semiconductor wafer after the protective film forming step;
   a plating step of forming an electrode plating film as the front surface electrode on a surface of the front surface electrode layer after the thinning step; and
   a rear surface electrode forming step of forming the rear surface electrode on the ground rear surface of the semiconductor wafer after the plating step,
   wherein the plating step of forming the electrode plating film is performed before the rear surface electrode forming step.

2. The method for manufacturing a semiconductor device according to claim 1, further comprising:
   a rear surface structure forming step of forming a semiconductor region forming a rear surface structure on a rear surface side of the semiconductor wafer after the thinning step and before the plating step,
   wherein in the rear surface electrode forming step, the rear surface electrode is formed to contact the rear surface structure.

3. The method for manufacturing a semiconductor device according to claim 1, wherein in the rear surface electrode forming step, the rear surface electrode is formed on the rear surface of the semiconductor wafer entirely by a sputtering method.

4. The method for manufacturing a semiconductor device according to claim 1, wherein in the rear surface electrode forming step, the rear surface electrode is formed by sequentially laminating a metal layer made of titanium, a metal layer made of nickel, and a metal layer made of gold on the rear surface of the semiconductor wafer.

5. The method for manufacturing a semiconductor device according to claim 1, wherein in the rear surface electrode forming step, the rear surface electrode is formed by sequentially laminating a metal layer made of aluminum, a metal layer made of titanium, a metal layer made of nickel, and a metal layer made of gold on the rear surface of the semiconductor wafer.

6. The method for manufacturing a semiconductor device according to claim 1, wherein in the thinning step, the thickness of the semiconductor wafer is reduced such that the thickness of the semiconductor wafer is equal to or greater than 30 µm and equal to or less than 250 µm.

7. The method for manufacturing a semiconductor device according to claim 6, wherein in the thinning step, the thickness of the semiconductor wafer is reduced such that the thickness of the semiconductor wafer is equal to or less than 140 µm.

8. The method for manufacturing a semiconductor device according to claim 1, wherein in the front surface electrode layer forming step, the front surface electrode layer made of aluminum silicon is formed, and
   in the plating step, the electrode plating film is formed by sequentially laminating a first plated film made of nickel and phosphorus, and a second plated film made of gold.

9. The method for manufacturing a semiconductor device according to claim 8, wherein in the plating step, the first plated film made of nickel and phosphorus is formed by an electroless plating method at a temperature equal to or more than 75° C. and equal to or less than 85° C.

10. The method for manufacturing a semiconductor device according to claim 8, wherein in the plating step, the first plated film including 2 wt % to 10 wt % of phosphorus is formed.

11. The method for manufacturing a semiconductor device according to claim 1, wherein in the plating step, the electrode plating film is formed by an electroless plating method.

12. The method for manufacturing a semiconductor device according to claim 1, wherein in the rear surface electrode forming step of forming the rear surface electrode, an end portion of the rear surface electrode extends over the protective film on the outer circumferential portion of the semiconductor wafer from the ground rear surface of the semiconductor wafer, and the electrode plating film is not formed over the end portion of the rear surface electrode extending over the protective film on the outer circumferential portion of the semiconductor wafer.

13. A method for manufacturing a semiconductor device including a semiconductor chip having a front surface electrode and a rear surface electrode provided on a front surface and a rear surface, respectively, the method comprising:
   a thinning step of grinding a rear surface of a semiconductor wafer forming the semiconductor chip to reduce a thickness of the semiconductor wafer;
   a front surface electrode layer forming step of forming a front surface electrode layer as the front surface electrode on a front surface of the semiconductor wafer after the thinning step;
   a protective film forming step of forming a protective film on the front surface of the semiconductor wafer such that a portion of the protective film exposes the front surface electrode layer and the protective film is retained on an outer circumferential portion of the semiconductor wafer after the front surface electrode layer forming step;
   a plating step of forming an electrode plating film as the front surface electrode on a surface of the front surface electrode layer after the protective film forming step; and
   a rear surface electrode forming step of forming the rear surface electrode on the ground rear surface of the semiconductor wafer after the plating step,
   wherein the plating step of forming the electrode plating film is performed before the rear surface electrode forming step.

14. The method for manufacturing a semiconductor device according to claim 13, further comprising:
   a rear surface structure forming step of forming a semiconductor region forming a rear surface structure on a rear surface side of the semiconductor wafer after the thinning step and before the plating step, wherein in the rear surface electrode forming step, the rear surface electrode is formed to contact the rear surface structure.

15. The method for manufacturing a semiconductor device according to claim 13, wherein in the rear surface electrode forming step, the rear surface electrode is formed on the rear surface of the semiconductor wafer entirely by a sputtering method.

16. The method for manufacturing a semiconductor device according to claim 13, wherein in the rear surface electrode forming step, the rear surface electrode is formed by sequentially laminating a metal layer made of titanium, a metal layer made of nickel, and a metal layer made of gold on the rear surface of the semiconductor wafer.

17. The method for manufacturing a semiconductor device according to claim 13, wherein in the rear surface electrode forming step, the rear surface electrode is formed by sequentially laminating a metal layer made of aluminum, a metal layer made of titanium, a metal layer made of nickel, and a metal layer made of gold on the rear surface of the semiconductor wafer.

18. The method for manufacturing a semiconductor device according to claim 13, wherein in the thinning step, the thickness of the semiconductor wafer is reduced such that the thickness of the semiconductor wafer is equal to or greater than 30 μm and equal to or less than 250 μm.

19. The method for manufacturing a semiconductor device according to claim 13, wherein in the front surface electrode layer forming step, the front surface electrode layer made of aluminum silicon is formed, and in the plating step, the electrode plating film is formed by sequentially laminating a first plated film made of nickel and phosphorus, and a second plated film made of gold.

20. The method for manufacturing a semiconductor device according to claim 13, wherein in the plating step, the electrode plating film is formed by an electroless plating method.

* * * * *

UNITED STATES PATENT AND TRADEMARK OFFICE
CERTIFICATE OF CORRECTION

PATENT NO. : 9,666,437 B2
APPLICATION NO. : 14/878480
DATED : May 30, 2017
INVENTOR(S) : Yuichi Urano It is certified that error appears in the above-identified patent and that said Letters Patent is hereby corrected as shown below:

In the Specification

Please change Column 8, Line 23, from "voltage Vice (sat) ..." to --voltage Vce (sat) ...--.

Signed and Sealed this
Fifteenth Day of August, 2017

Joseph Matal
*Performing the Functions and Duties of the*
*Under Secretary of Commerce for Intellectual Property and*
*Director of the United States Patent and Trademark Office*